United States Patent
Runge et al.

(10) Patent No.: US 6,622,279 B1
(45) Date of Patent: Sep. 16, 2003

(54) COMPUTER FOR DATA PROCESSING AND METHOD FOR DATA PROCESSING USING A COMPUTER

(75) Inventors: Holger Runge, Hildesheim (DE); Johannes Kneip, Regensburg (DE); Bjoern Bunte, Unna (DE); Henning Moeller, Obernkirchen (DE)

(73) Assignee: Robert Bosch GmbH, Stuttgart (DE)

( * ) Notice: Subject to any disclaimer, the term of this patent is extended or adjusted under 35 U.S.C. 154(b) by 463 days.

(21) Appl. No.: 09/633,409

(22) Filed: Aug. 7, 2000

(51) Int. Cl.[7] .............................................. H03M 13/00
(52) U.S. Cl. ...................................... 714/779; 714/781
(58) Field of Search ................................ 714/799, 781, 714/779; 386/94; 382/252, 239; 358/133

(56) References Cited

U.S. PATENT DOCUMENTS 3,701,108 A * 10/1972 Loh et al. ...................... 341/67
4,181,976 A    1/1980 Collins et al.
4,185,302 A * 1/1980 Mounts et al. .............. 382/238

OTHER PUBLICATIONS

Stoldberg et al., Hans–Joachim, "Fast VLD Implementation on V830 RISC Processor," Information Technology Research Labs, NEC Corp., p. 128.
Berekovic et al., M., "Architecture of a Hardware Module for MPEG–4 Shape Decoding," Laboratorium für Informationstechnologie, Institut für Theoretische Nachrichtentechnik und Informationsverarbeitung, Universität Hannover.
Berekovic et al., Mladen, "Instruction–Set Extensions for MPEG–4," Laboratorium für Informationstechnologie, Robert Bosch GmbH, Advanced Multimedia, Universität Hannover.

* cited by examiner

Primary Examiner—Albert Decady
Assistant Examiner—Mujtaba K. Chaudry
(74) Attorney, Agent, or Firm—Kenyon & Kenyon

(57) ABSTRACT

A computer for data processing and a method for data processing using a computer, each of which is used for reversing, with the aid of a circuit arrangement, the bit sequence of the information, which was coded with a reversible Huffman code, when an error occurs, so that the computer decodes the reversed bit sequences using a suitable code table. In the computer, a data buffer is connected to a register in such a way that the bit sequence is reversed when transferred from the data buffer to the register. The bit sequence is not reversed when it is retransferred from the register into the data buffer. In this way, information which is located after the error does not get lost. Since to reverse the bit sequence, the end of the bit sequence, designated by a synchronization bit sequence, must be found, the synchronization bit sequence is disposed at byte boundaries due to padding bits. In this way, synchronization bit sequences are located only at byte boundaries. Since the computer must load code tables for the decoding, various reversible and non-reversible codes can be used. The computer recognizes the beginning of a group of coded information on the basis of the synchronization bit sequence.

11 Claims, 1 Drawing Sheet

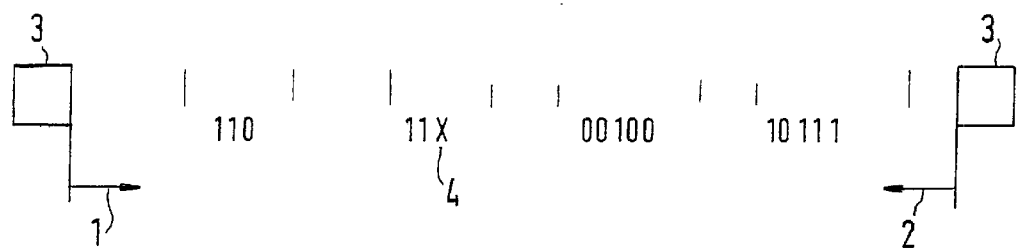
FIG.1
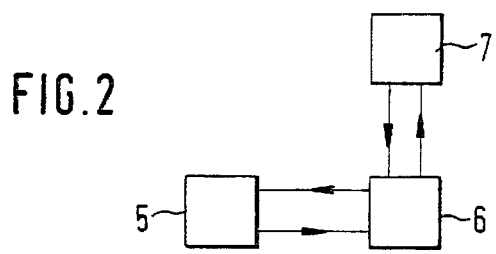
FIG.2
FIG.3
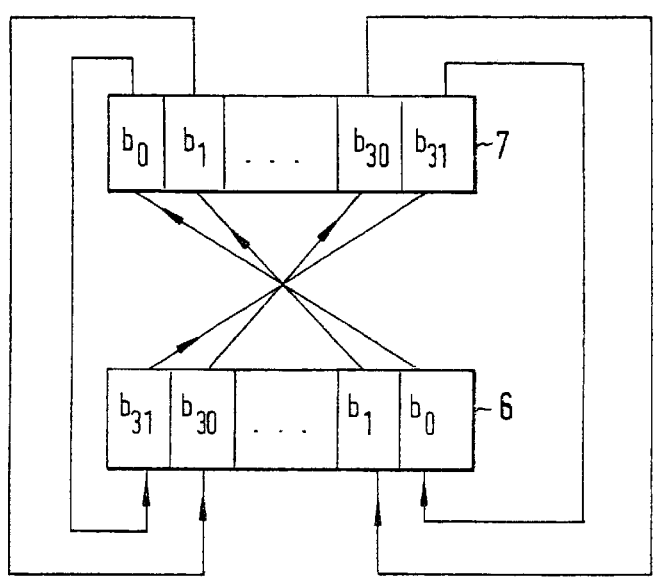

COMPUTER FOR DATA PROCESSING AND METHOD FOR DATA PROCESSING USING A COMPUTER

FIELD OF THE INVENTION

The invention relates to a computer for data processing and a method for data processing using a computer.

BACKGROUND INFORMATION

It is already known that reversible codes, particularly Huffman codes, are used for coding information in multimedia applications. This reversible code has the characteristic that a reverse decoding of the trailing code sequence is possible when a forward decoding fails because an error has occurred. Furthermore, synchronization bit sequences with which the end of groups of code words is recognized are inserted for the reverse decoding. In this context, the bit sequence of the code words is turned around by placing a pointer on the starting address of the last code word of the group on the last bit of the code word with the aid of software.

SUMMARY OF THE INVENTION

In contrast, the computer and method according to the present invention have the advantage that, in the case of an error in a code word, groups of code words are prepared for the reverse decoding by a circuit arrangement. The reversal of the bit sequence of the code words of a group by the circuit arrangement in the case of an error saves computing capacity, since then the reversal is carried out in a computing cycle.

It is particularly advantageous that groups of code words are separated by synchronization bit sequences. These synchronization bit sequences are inserted at the earliest point after a previously defined number of bytes. The beginning of the synchronization bit sequence is brought to a uniform byte boundary by so-called padding bits. This permits a simple further processing, particularly the reversal of the bit sequences, by hardware.

It is also advantageous that the computer loads code tables of various reversible and non-reversible codes, in order to decode correspondingly coded information. This yields great flexibility of the codes utilized.

Another advantage is that the computer recognizes the beginning of the groups of data by the synchronization bit sequence.

The computer advantageously recognizes through a counter that all code words or all bits of a group have been decoded. In this manner, the computer recognizes that the remaining bits up to the next synchronization bit sequence are padding bits or the synchronization bit sequence follows directly after the end of the last code word, provided that it adjoins a byte boundary.

BRIEF DESCRIPTION OF THE DRAWINGS

FIG. 1 shows a group of code words embedded in synchronization bit sequences.

FIG. 2 shows a block diagram of a circuit arrangement for the decoding and reversal of a bit sequence in the case of an erroneous bit.

FIG. 3 shows the schematic linking of two registers for reversing a bit sequence of a group of code words.

DETAILED DESCRIPTION

FIG. 1 shows a group of code words embedded in synchronization bit sequences 3. The code words are separated from each other by inverted commas. An error is inserted in the second code word by X 4. Normal reading direction 1 is indicated with an arrow beginning from left synchronization bit sequence 3. Reverse reading direction 2 is indicated with an arrow starting from right synchronization bit sequence 3.

The code words are coded with a reversible Huffman code. In a Huffman code, information to be coded is coded with various lengths. That is to say, information such as letters of the alphabet which occur with greater frequency in a language are coded with fewer bits than those which occur with only low probability. For example, E is the letter of the alphabet occurring most frequently in the German language. Therefore, it is coded with fewer bits than, for example, the X which occurs far less frequently.

Reversible codes have the characteristic that information coded with reversible codes can be decoded in both reading directions, thus, from left to right and from right to left. For that purpose, tables must be made available to the decoder, with which it can decode code words in both directions.

A code word designates coded information, for whose code the computer, as decoder, finds an entry in a table. In this context, a plurality of code words, four in this case, are combined to form a group. This group is bound by two synchronization bit sequences, each of which begins at a byte boundary. If the length of the coded information is not a multiple of a byte, then padding bits are inserted so that the following synchronization bit sequence begins at a byte boundary.

A computer as decoder will differentiate the individual code words only by combining so many bits for a code word until it has found an equivalent bit sequence in a code table. Since the padding bits are added at the end of the group of code words, the last code word prior to the padding bits is decoded, while the padding bits are recognized as not being decodable. The padding bits are indicated by a zero, whereupon ones then follow until the group is filled up to the necessary length so that the following synchronization bit sequence begins at a byte boundary. A counter marks how many bits belong to the code words or how much coded information is to be expected in the group, so that decoding is stopped prior to the padding bits.

Alternatively, in the data stream in which the code words are located, information can be included as to how many code words or how much coded information are/is combined in a group, so that it is recognized through a counter when the decoding of the group has ended here, as well. The counter, which, for example, is set during the formation of the group, can include how many code words are contained in a group, or how many bits belong to the code words of a group, or how much coded information belongs to a group.

An error in a code word is only recognized because the bit sequence is no longer decodable, thus, the bit sequence was changed by the error to the extent that it does not correspond to any code word in the code table of the computer. However, if the result of the error is that the code word was changed by the error into a different decodable code word, the error is not recognized by the computer. Furthermore, if a plurality of errors occur, and they result in decodable code words, then no error is recognized. If two errors occur that result in code words, which cannot be decoded, and therefore are recognized, the code words between the two errors are no longer to be decoded.

After the computer has recognized error 4, it analyzes the next byte beginning at the next byte boundary and checks whether the following bit sequence corresponds to the synchronization bit sequence. If the computer has found synchronization bit sequence 3, the computer turns the bit sequence of the group around and begins to decode the two right code words, thus the fourth and the third code words, in reverse direction 2. In this context, the second code word with the error gets lost. If padding bits were used, first all ones are erased until the zero is recognized. Decoding is then begun after the zero.

FIG. 2 shows a block diagram of the circuit arrangement for the decoding and reversal of the bit sequence in the case of an erroneous bit. A main memory 5 is connected to a data buffer 6. Data buffer 6 is connected to register 7 via a first data output and a data input. Data buffer 6 transfers the bit sequence of a group of code words to be reversed to register 7 via the first data output. Data buffer 6 is connected to main memory 5 via a second data output. The reversed bit sequences arrive back in main memory 5 from data buffer 6.

A group of code words is recognized in main memory 5 on the basis of the synchronization bit sequence. The synchronization bit sequence is a bit sequence which the computer knows, since it has stored it permanently and thus recognizes it clearly by comparison. In this context, the bit sequence does not correspond to any code word and is therefore easy to distinguish from code words.

The decoding is carried out by the computer in main memory 5. To that end, the computer has loaded tables with code words and the corresponding plain text into main memory 5.

If an error occurs within a group, the bit sequence of the group, starting from the synchronization bit sequence that concludes the group up to the error, which has occurred, is transferred in word mode to data buffer 6. The bit sequence of the group is reversed by a transfer to register 7 from data buffer 6. In this context, register 7 is connected to data buffer 6 in such a way that the bit lines of the individual cells of data buffer 6 lead in each case to the inverse bit in register 7. The reversed bit sequence is then retransferred into data buffer 6 from register 7, the reversed sequence being retained. Then the reversed bit sequence is transferred back into the main memory.

The computer now decodes the code words of the group with the aid of a further code table for code words that are to be decoded in reverse direction. The decoded code words are available in main memory 5 for further processing. For example, the decoded code words can now be used to display information on a monitor.

FIG. 3 shows schematically how data buffer 6 is connected to register 7, so that if an error occurs, the bit sequence is reversed. One can see that the lines of the cells of the data buffer are connected crosswise to the cells of the register. That means that the bit which is in the right cell of data buffer 6 and is designated by $b_0$ is located again in register 7 in the cell completely to the left. In this manner, the bit sequence is reversed on the basis of the interconnection of the cells of the data buffer and of register 7. Each cell of register 7 has an output which is connected to the cells of data buffer 6, such that the reversed sequence of the bits is retained, that is to say, the bit completely to the right in register 7 will also be the bit completely to the right in data buffer 6.

Due to the implementation of the reversal of the bit sequence by a circuit arrangement, only one command is needed in a program, which runs on the computer, in order to reverse the bits.

What is claimed is:

1. A computer for processing data, the data being generated with a reversible code and including bit sequences having various lengths, the computer comprising:

memory;

a register;

a data buffer coupled to the register so that a bit sequence of data transmitted from the data buffer to the register is reversed, the register being coupled to the data buffer so that a bit sequence of data transmitted from the register to the data buffer is maintained, wherein a group of data is enclosed by synchronization bit sequences; and at least one arrangement that performs the steps of:

transferring the data of a group from the data buffer into the register when an erroneous bit is recognized in a bit sequence of the data of the group, retransferring the data from the register into the data buffer, the data being retransfered so that the bits in the data buffer have the same sequence as in the register, and comparing and decoding bit sequences up to the erroneous bit using stored bit sequences for decoding bit sequences having bits in reversed sequence.

2. The computer according to claim 1, wherein:

the reversible code includes the Huffman code.

3. The computer according to claim 1, wherein:

the computer performs the further step of changing the group of data enclosed by the synchronization bit sequences to a word-oriented bit length using padding bits.

4. The computer according to claim 3, wherein:

the computer performs the further step of loading known bit sequences for decoding of data in the memory, the data being coded with one of reversible codes and non-reversible codes.

5. A method for processing data using a computer, the data including bit sequences having various lengths and being generated with a reversible code, the method comprising the steps of:

in the computer, transferring the data of a group when an erroneous bit is recognized by the computer in a bit sequence of the data of the group, the data being transferred so that a sequence of the bits of the data of the group become reversed, the group of data being enclosed by synchronization bit sequences;

in the computer, retransferring the data of the group with the bits in reversed sequence;

in the computer, comparing and decoding bit sequences up to the erroneous bit using bit sequences stored for decoding bit sequences having bits in reversed sequence.

6. The method according to claim 5, wherein:

the reversible code includes the Huffman code.

7. The method according to claim 5, further comprising the step of:

changing the group of data enclosed by synchronization bit sequences to a uniform length by padding bits.

8. The method according to claim 7, further comprising the step of:

loading known bit sequences for decoding of data that has been coded with one of reversible codes and non-reversible codes.

9. The method according to claim 8, further comprising the step of:

recognizing a beginning of the bit sequence to be decoded by the synchronization bit sequences that enclose the group of data.

10. The method according to claim 9, further comprising the step of:

storing the number of bits of the group in a counter, so that the end of the group is recognized by decrementing the counter.

11. The method according to claim 9, further comprising the step of:

storing the number of code words of the group is stored by a counter, so that the end of the group is recognized by decrementing the counter.

* * * * *